United States Patent
Peng et al.

(10) Patent No.: US 8,377,798 B2
(45) Date of Patent: Feb. 19, 2013

(54) METHOD AND STRUCTURE FOR WAFER TO WAFER BONDING IN SEMICONDUCTOR PACKAGING

(75) Inventors: Jung-Huei Peng, Jhubei (TW); Hsin-Ting Huang, Bade (TW); Yao-Te Huang, Hsinchu (TW); Shang-Ying Tsai, Pingzhen (TW); Ping-Yin Liu, Yonghe (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 0 days.

(21) Appl. No.: 12/943,281

(22) Filed: Nov. 10, 2010

(65) Prior Publication Data

US 2012/0115305 A1    May 10, 2012

(51) Int. Cl.
*H01L 21/30* (2006.01)
*H01L 21/46* (2006.01)
*H01L 21/311* (2006.01)

(52) U.S. Cl. ............... 438/455; 438/703; 257/E21.214
(58) Field of Classification Search .................. None
See application file for complete search history.

(56) References Cited

U.S. PATENT DOCUMENTS

2006/0264004 A1*  11/2006  Tong et al. ............... 438/455
2008/0171443 A1*   7/2008  Hebras .................... 438/703

* cited by examiner

*Primary Examiner* — Fernando L Toledo
*Assistant Examiner* — Valerie N Newton
(74) *Attorney, Agent, or Firm* — Duane Morris LLP

(57) ABSTRACT

A method for wafer to wafer bonding in semiconductor packaging provides for roughening the bonding surfaces in one embodiment. Also provided is a method for passivating the bonding surfaces with a lower melting point material that becomes forced away from the bonding interface during bonding. Also provided is a method for forming an eutectic at the bonding interface to reduce the impact of any native oxide formation at the bonding interface.

23 Claims, 4 Drawing Sheets

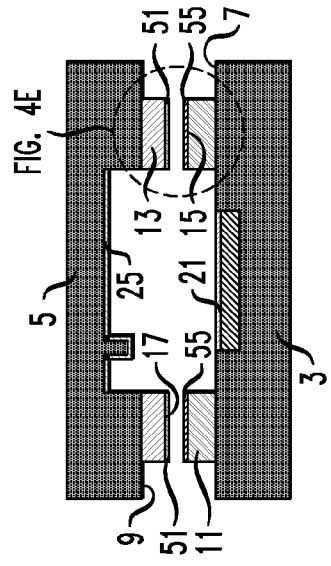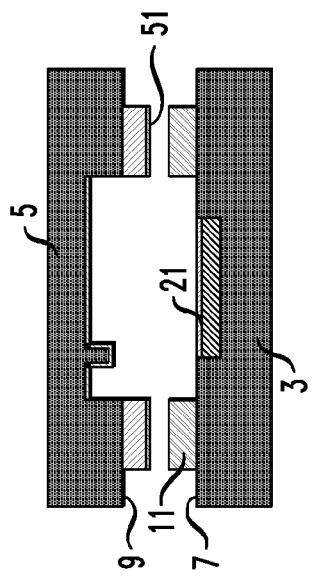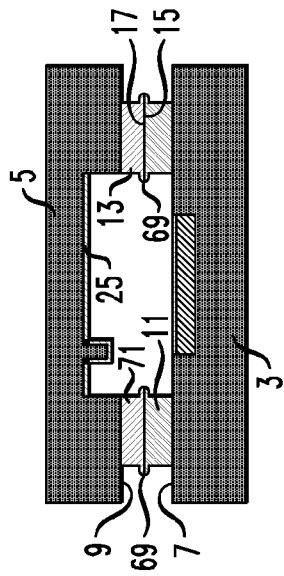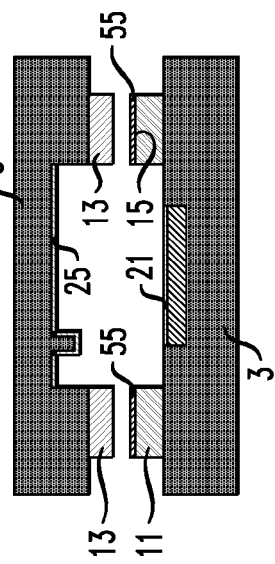

METHOD AND STRUCTURE FOR WAFER TO WAFER BONDING IN SEMICONDUCTOR PACKAGING

FIELD OF THE INVENTION

The present invention relates, most generally, to the semiconductor manufacturing industry and, more particularly, to structures and methods for bonding semiconductor chips together in semiconductor packaging.

BACKGROUND

In today's electronics industry, advanced packaging techniques are being developed and continue to be developed to increase levels of integration. Semiconductor devices are formed on a semiconductor substrate, also known as a wafer, which includes a multitude of individual semiconductor devices, known as chips after they are separated from one another. After semiconductor devices are formed on a semiconductor substrate, and separated into the individual chips, the chips must be bonded to other chips and/or other components and it is logically desirable to join as many semiconductor chips as possible in a package of reduced size.

All of the bonding techniques used in chip to chip bonding involve joining opposed surfaces of the bonding materials formed on the respective chips. The bonding materials may be a metal or a metal alloy and in each case, it is a challenge to provide good contact and a strong bond between the bonding materials of the respective chips especially since the bonding surfaces are prone to oxidation after they have been formed and patterned and the presence of a surface oxide limits metal to metal diffusion such as needed to form a strong metal bond. The time delay between the deposition of the bonding material, the patterning of the bonding material and the actual bonding can be considerable and the metal surfaces can oxidize during these time delays, inhibiting the subsequent metal diffusion between bonding surfaces and degrading bonding strength and quality, adversely impacting the package's quality.

It would therefore be desirable to overcome these limitations and provide a method and structure that provides high bonding strength and eliminates the source and impact of bond degradation such as native oxides.

Wafer Level Chip Scale Packaging, WLCSP, and other hermetic packaging techniques bond chips directly together and can be used to produce finer pitch semiconductor device packages and products that do not require wires or pins but instead utilize contact pads. Direct chip to chip, also referred to as wafer to wafer bonding techniques are utilized in such advanced packaging techniques and require superior wafer bonding strength and hermeticity for package qualification. Each of these aspects requires high quality bonding surfaces to be joined together.

Previous approaches to improved bonding techniques include the development of glass frit and anodic bonding techniques to achieve hermetic packaging. These techniques have limited applicability, however, as they are not scalable for the bonding of smaller devices and are not appropriate for the bonding of semiconductor chips utilizing CMOS technology and structure or MEMS, micro-electromechanical structures.

Bonding techniques that provide high bonding strength and hermeticity in wafer to wafer bonding, are needed.

BRIEF DESCRIPTION OF THE DRAWINGS

The present invention is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 4a-4g are cross-sectional views illustrating another exemplary chip to chip bonding method of the invention. FIG. 4d shows bonded chips produced from either of the structures shown in FIGS. 4a-4c and FIGS. 4e-4g are exploded views showing the sequence of steps at the bonding interface.

DETAILED DESCRIPTION

Aspects of the invention provide wafer to wafer bonding with improved wafer to wafer bonding strength and hermetic quality. According to one exemplary embodiment, the bonding surfaces are roughened prior to being joined to one another, in order to shatter or fragment any native oxide layer that may be present on the bonding surfaces prior to joining and also to increase bonding surface area. According to another exemplary embodiment, the opposed bonding surfaces are passivated with lower melting point material that prevents oxidation of the bonding surfaces and enables the opposed bonding surfaces to be brought into direct contact with one another without native oxide formation. According to another exemplary embodiment, a eutectic intermediate layer is formed on the bonding surfaces thereby lowering the melting point temperature and enabling the breakup or fragmentation of any native oxide layer that may have formed, during the bonding procedure.

Figure 1:
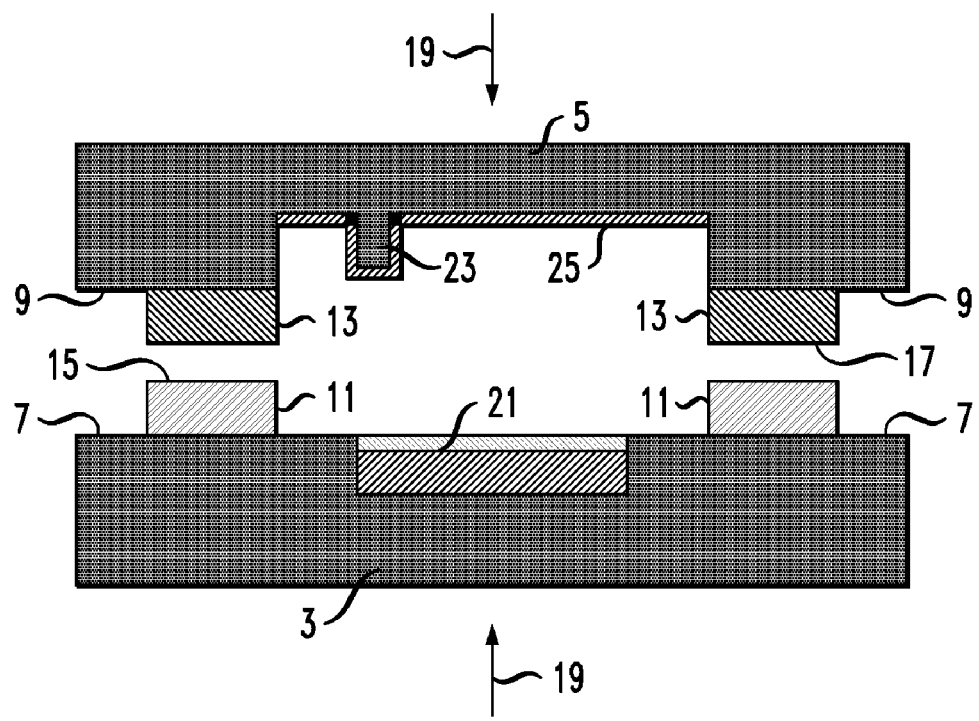
FIG. 1 is a cross-sectional view showing two chips ready for bonding according to an exemplary method of the invention.

FIG. 1 is a cross-sectional view showing two wafers 3, 5 generally aligned and ready to be bonded together. Wafer 3 includes bonding surface 7 and wafer 5 includes bonding surface 9, bonding surfaces 7 and 9 facing each other in the illustrated embodiment. Bonding material 11 with bonding material surface 15 is on bonding surface 7 of substrate 3 and bonding material 13 with bonding material surface 17 is disposed on bonding surface 9 of wafer 5. As noted supra, some of the illustrated features have been arbitrarily expanded for clarity, distorting the relative dimensions of the features. Each of wafers 3 and 5 may be a chip containing an individual semiconductor device or wafers 3 and 5 may be an integrated substrate with multiple individual semiconductor devices. Wafers 3 and 5 may each be a semiconductor substrate that includes semiconductor devices formed using various technologies. In the illustrated embodiment, wafers 3 and 5 include different features but it should be understood that in other exemplary embodiments, wafers 3 and 5 may be identical.

In the illustrated embodiment, wafer 3 includes semiconductor device structure 21 and wafer 5 includes semiconductor device structure 23 but these are intended to be exemplary only. Anti-stiction layer 25 which may be a teflon-like material or other suitable material is formed on substrate 5 in the illustrated embodiment but may be formed on either or both of wafers 3, 5 in other exemplary embodiments. The teflon-like coating is applied to the surfaces that will not be bonded in order to prevent micro stiction, the phenomenon by which two surfaces in contact with one another adhere to one another. Bonding materials 11 and 13 may be any of various suitable metals or metal alloys and may also include suitable dopant species. Bonding materials 11 and 13 may be formed on the respective substrates through various deposition operations such as PVD (physical vapor deposition), sputtering, plating, evaporation, CVD (chemical vapor deposition) or other deposition operations. Suitable bonding materials include aluminum, Al, tin, Sn, germanium, Ge, gold, Au, copper, Cu, silicon, Si and lead, Pb but other suitable bonding materials may also be used. Conventional semiconductor fabrication methods may be used to produce wafers 3 and 5 to include various semiconductor devices thereon such as CMOS devices and/or MEMS (micro-electromechanical structure) devices. Each of bonding materials 11 and 13 appear as patterned film segments, i.e. they do not extend completely over their respective bonding surfaces 7, 9. Various suitable and known techniques may be used to pattern the bonding material to produce the patterned segments of bonding materials 11 and 13 illustrated in FIG. 1.

One or both of the opposed bonding material surfaces 15, 17 is roughened according to one aspect of the invention to increase contact area and reduce leakage paths. The roughened surfaces with sharp edge peaks will help break through surface native oxides that may form on the bonding interfaces and enhance diffusive interaction between the respective bonding materials 11, 13. The following exemplary methods of roughening the bonding material surfaces may apply to either or both of bonding material surfaces 15 and 17 and will be carried out during or after the formation of the surface and prior to the surfaces being bonded together.

According to one exemplary embodiment, after the bonding material is formed, it is roughened using a subsequent roughening process such as a surface bombardment process such as sputter etching or ion milling. Various suitable etch species may be used for sputter etching and various suitable sputter cleaning operations are available and may be used. Various suitable inert species may be used for ion milling and the operation or operations may be carried out using various conventional processing techniques and various conventional processing tools. In one exemplary embodiment, a sputter clean operation using Ar bombardment for a few seconds may be used. According to another exemplary embodiment, the deposition process used to form bonding material 11, 13 may have its deposition parameters controlled in the latter stages of the deposition operation to provide large grain sizes and rough surfaces. The deposition process recipe may be tuned by adjusting parameters such as but not limited to temperature, dopant species, doping level, gas species used, gas ratio, deposition rates and so forth, to form a material with relatively large grain sizes and a roughened, irregular surface with peaks and valleys and sharp edges.

According to another exemplary embodiment, the surface may be roughened by implanting or thermally diffusing a species such as an element, into bonding material 11 or 13 to cause the species to form eutectic grain compounds within the layer of bonding material. A wet etching operation may then be used to strip a thin layer of the surface of the layer of bonding material, such as a few hundred nm in one exemplary embodiment. The etchant species is chosen such that an rate difference between the grain compound and the bulk of the bonding material may result in a roughened upper surface. In one exemplary embodiment utilizing Al—Ge bonding, an Al layer having a thickness of about 2000 A may be deposited on a germanium, Ge bonding layer 11 or 13 of about 8000 A at an elevated temperature such as 200° C. which may create the eutectic grain compounds. This may be followed by wet etch in a $H_3PO_4$ and $HNO_3$ mixture to selectively remove Al completely and roughen the germanium surface by over-etch. This etched layer of bonding material exhibits bulging or elevated grains as a result.

According to yet another embodiment, a post-deposition annealing process may be utilized and optimized to produce a rough surface.

Figure 2:
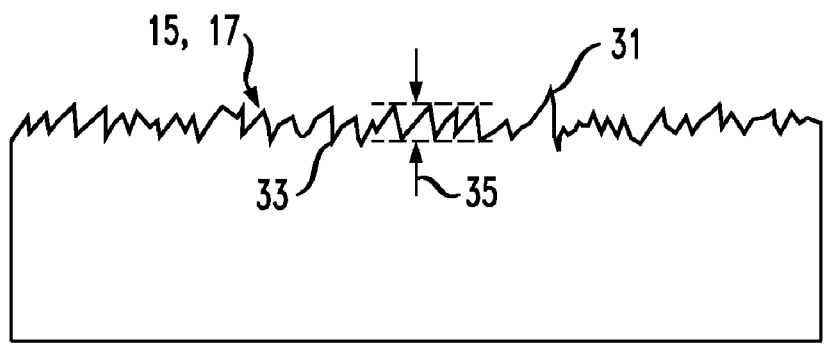
FIG. 2 is a cross-sectional view showing a roughened bonding surface according to one aspect of the invention.

FIG. 2 is a cross-sectional view showing an exemplary bonding material surface 15, 17 that is roughened. The roughened surface includes peaks 31 and valleys 33 and average step height 35. Peaks 31 and valleys 33 may be relatively sharp. The average step height 35 may characterizes the roughness and this step height may range from about 100 angstroms to 2 µm in various exemplary embodiments. Other step heights may be produced in other exemplary embodiments.

According to one exemplary embodiment, further bonding material may be formed on the roughened bonding surfaces. According to one exemplary embodiment, a thin seed layer such as polysilicon or other suitable material, may be formed on the roughened surface prior to the formation of the further bonding material. The seed layer may be annealed to become crystallized and produce a larger grain size. The further bonding material includes a top surface with prominent apices formed over the sharp apices of peaks 31. With or without the optional additional bonding material and seed layer, the opposed roughened bonding surfaces are then joined to one another. Conventional and suitable techniques for bonding the surfaces together may be used. Returning to FIG. 1, wafers 3 and 5 are oriented as illustrated such that bonding surfaces 7 and 9 face each other. Wafers 5 and 3 are aligned and pressure 19 is applied urging opposed bonding surfaces 7, 9 toward one another. Suitable and appropriate bonding pressures and temperatures are chosen for bonding the opposed bonding materials 11, 13 together. One aspect of this embodiment is that increased surface area between the bonding surfaces 15, 17 is produced. Another aspect is that sharp edges including the illustrated sharp apices of the roughened bonding surface or the elevated grains as described above, can cause the fragmentation or shattering or break up of any native oxide film such as may be formed on the opposed bonding surface. These aspects produce a superior bond characterized by hermeticity and superior bonding strength.

Figure 3A:
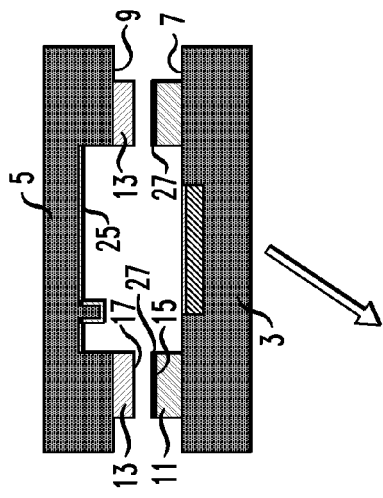
FIGS. 3a-3d are cross-sectional views that show an exemplary chip to chip bonding technique according to the invention, with FIG. 3d showing bonded chips produced from either of FIGS. 3a-3c.
Figure 3B:
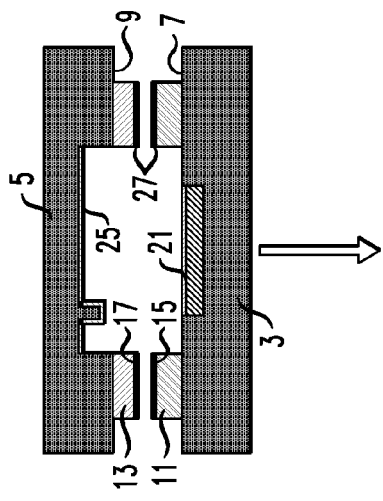
Figure 3C:
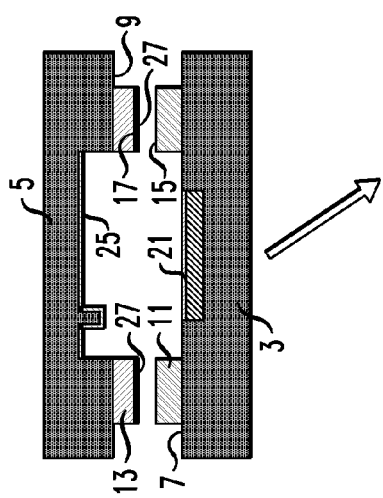
Figure 3D:
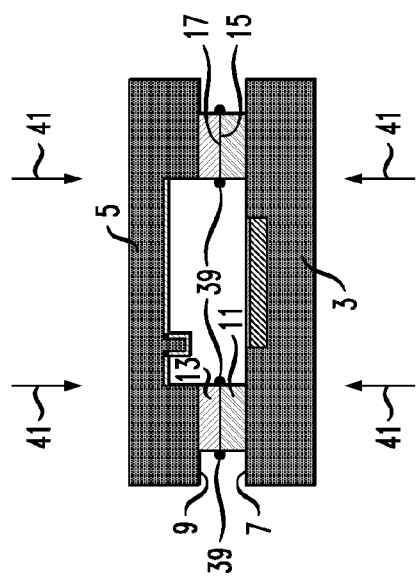

According to another aspect of the invention, a low melting point passivation material may be formed upon either or both of opposed bonding surfaces prior to bonding. FIG. 3a illustrates an embodiment in which bonding material surfaces 17 of upper wafer 5 include passivating material 27; FIG. 3b illustrates an embodiment in which passivating material 27 is formed on each of bonding material surfaces 15 and 17 of wafers 3 and 5 and FIG. 3c illustrates an embodiment in which passivation material 27 is formed only on bonding material surface 15 of bonding material 11 of substrate 3. After either of the aforementioned pairs of wafers 3, 5 of FIGS. 3a-3c are joined together, the pair produces the bonded wafers 3, 5 shown in FIG. 3d.

For the sake of brevity, only the embodiment illustrated in FIG. 3b will be described in further detail herein, but this description similarly applies to the embodiments illustrated in FIGS. 3a and 3c.

After the aforedescribed bonding materials 11, 13 are formed on bonding surfaces 7, 9 and before bonding materials 11, 13 are patterned, the bonding material surfaces are cleaned and a passivating material with a melting point lower than that of the corresponding bonding material, is formed over the bonding material. The cleaning and passivating material may be formed on either or both of bonding material surfaces 15, 17 as in FIGS. 3a-3c. According to one exemplary embodiment, the bonding material surface such as bonding material surface 15 or 17 may be cleaned by first using a plasma sputtering clean operation followed by a wet clean. The wet clean may include an HF dip, immersion in or exposure to forming acid vapor and then a DI water rinse. The surface cleaning processes are processes that are capable of removing oxide films that may form on the exposed bonding material surfaces and in other exemplary embodiments, other cleaning operations that are capable of removing oxide films, may be used.

A passivating material is next formed over the cleaned bonding material surface as soon as possible and preferably within 72 hours of the formation of the bonding material. According to other exemplary embodiments, the queue time between surface cleaning and the subsequent formation of passivation material may range from 6 hours to a number of days. Passivating material 27 may be any of various suitable passivating materials such as Sn, Cu, Au, Ge, Ni, and various other metals or alloys such as Ge—Al or Au—Si. In each case, the passivating material 27 is chosen to include a melting point that is lower than the melting point of the bonding material upon which passivating material 27 is formed. According to one exemplary embodiment, the melting point of passivating material 27 may be less than about 450° C. After passivating material 27 has been formed over the bonding material to form a composite film structure and using any of various suitable deposition techniques, a conventional patterning operation is carried out to form the patterned segments of the composite film structure including passivating material 27 and the associated bonding material 11, 13, such as illustrated in FIGS. 3a-3c.

A bonding operation takes place in which a suitably high temperature is applied and pressure 41 is exerted to join wafers 3, 5 with opposed bonding surfaces 7, 9, together. Since passivating material 27 has a lower melting temperature than the corresponding bonding material 11, 13 upon which it is formed, when heat is applied during the bonding process, the elevated temperature will initially cause the passivating material 27 to melt before the bonding material 11 or 13 melts. As pressure, indicated by arrows 41, is applied, the melted passivating material 27 becomes squished or laterally extruded and forced laterally outside of the joined composite film segments thus enabling opposed bonding surfaces 15 and 17 to contact each other with extruded passivating material 39 squished or forced outside the sidewalls of the opposed patterned segments of composite films that are now bonded together. Since any native oxide layer formation will occur on the lower melting point passivating material that will be melted prior to bonding, any such native oxide will be broken up and fragmented prior to the bonding of the bonding materials which are heated but not completely melted. As the passivating material melts, additional pressure and higher temperatures may be applied to continue the bonding process and foster metal to metal migration between the bonding materials 11 and 13, as desired.

FIGS. 4a, 4b and 4c each illustrate embodiments that can be used to form the bonded structures shown in FIG. 4d. According to these exemplary embodiments, either or both of the opposed bonding surfaces has a further material formed upon the bonding material to create a eutectic with a lower melting point. A eutectic is a mixture of substances in fixed proportions that melts and freezes at a single temperature that is lower than the melting points of the separate constituents or of any other mixture of them. During the bonding process, the applied temperature and pressure cause intermixing and melting of the eutectic and the breakup of any oxide layer that may be formed on one of the exposed surfaces.

FIG. 4a shows an embodiment in which the eutectic material is formed only on the bonding materials on upper wafer 5; FIG. 4b shows an embodiment in which the eutectic is formed on the bonding materials on each of wafers 3 and 5 and FIG. 4c shows an embodiment in which the eutectic is formed only on the bonding material formed on lower wafer 3. For brevity, this eutectic embodiment will be described in conjunction with the embodiment illustrated in FIG. 4b but it should be understood that this method applies equally to the embodiments illustrated in FIGS. 4a and 4c.

Now referring to FIG. 4b, bonding material 11 is formed on bonding surface 7 of wafer 3 and bonding material 13 is formed on bonding surface 9 of wafer 5. FIG. 4b shows eutectic layer 51 formed on bonding material surface 17 of bonding material 13 and eutectic layer 55 formed on bonding material surface 15 of bonding material 11. So-called eutectic layer 51 and eutectic layer 55 are identified as such because they will form a eutectic in combination with the respective bonding material 17, 15 upon which they are formed. The composite film segments shown in FIG. 4b may be formed according to similar methods described in conjunction with FIG. 3b, i.e. after the respective bonding material 11, 13 is formed, the sputter and wet etch cleaning processes may be carried out upon bonding surfaces 15, 17. In other exemplary embodiments, the bonding material 11, 13 and the subsequent formation of the associated eutectic material 51,55 may represent an in-situ operation. At any rate, once the eutectic material 51,55 is formed over the respective bonding material surface, the composite film structure is patterned to form the composite patterned segment illustrated in FIG. 4b.

According to one advantageous embodiment, eutectic layer 51 may be chosen to be the same material as bonding material 11 and eutectic layer 55 may be chosen to be the same material as bonding material 15. Exemplary materials that may be used for bonding materials 11, 13 and eutectic layers 51, 55 include Sn, Cu, Au, Ge, Ni, Al, or other suitable metals or alloys.

Figure 4E:
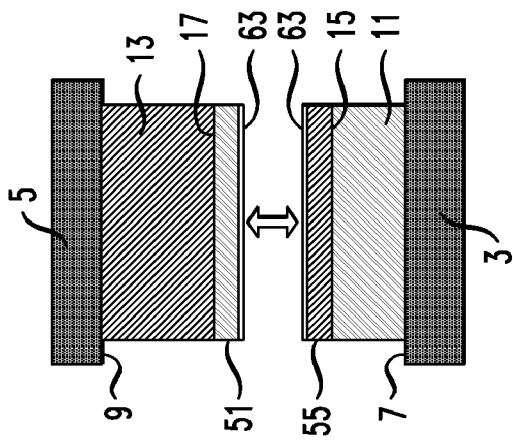

According to one advantageous embodiment, bonding material 11 and eutectic 51 may be Al and bonding material 15 and eutectic 55 may be Ge. The thickness of the eutectic layer 51, 55 may range from about 5000-1500 and may advantageously be about 1000 angstroms but other thicknesses may be used in other exemplary embodiments. FIG. 4e represents an expanded view of the identified portion of FIG. 4b. The expanded view of FIG. 4e shows native oxide layers 63 formed on respective eutectic layers 51, 55. The formation of the eutectic from the eutectic layer and corresponding bonding material lowers the melting point of the mixture significantly. In one exemplary embodiment, such as in which bonding material 11 is Ge, the Ge bonding material may include a melting point of about 800° C. According to the embodiment in which eutectic layer 55 is Al formed over Ge bonding material 11, the melting point of the Ge, Al eutectic formed may be about 450° C. According to an advantageous embodiment, eutectic layer 51 may be Ge formed over Al bonding material 13.

Figure 4F:
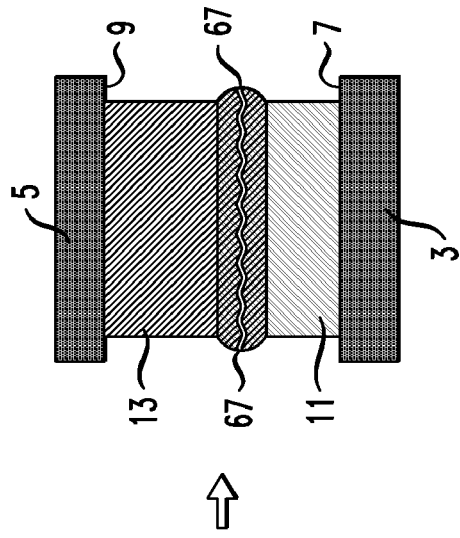
Figure 4G:
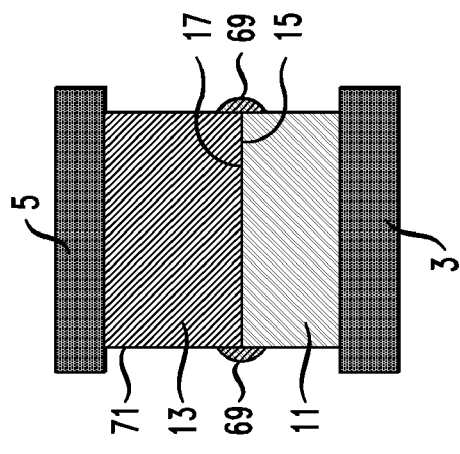

According to either of the eutectic embodiments shown in FIGS. 4a-4c, when the arrangement is heated and pressure is exerted, even though native oxide layers 63 have been formed, the opposed eutectic materials melt at the depressed eutectic melting point. The melted eutectic layers on the opposed wafers 3, 5 combine to break up, i.e. fragment, any oxide layer such as oxide layers 63. Since any native oxide layer formation will occur on a material that will be melted prior to bonding, the native oxide will be broken up and fragmented prior to the bonding of the bonding materials which are heated but not completely melted. When the wafers 3, 5 are heated past the eutectic melting points and urged together, they crush any formed oxide layers 63 and combine to form eutectic intermediate layer 67 such as illustrated in FIG. 4f. As temperature is continued to be applied and the bonding pressure exerted, the melted materials of intermediate eutectic intermediate layer 67 are forced laterally outside sidewalls 71 of the composite film structure segments allowing bonding material surfaces 15 and 17 to contact one another and form a strong bond, with excess eutectic material 69 disposed peripherally outside the joined opposed bonding materials 11, 13.

The foregoing description merely illustrates principles and exemplary embodiments of the invention.

According to one aspect, the present invention provides a method for bonding substrates to one another. The method comprises: providing a duality of substrates, each substrate including a bonding surface; depositing a layer of bonding material on each bonding surface, each layer of bonding material including an upper surface; roughening at least one upper surface to produce a roughened upper surface; depositing further bonding material on the at least one roughened upper surface; orienting the substrates such that the bonding surfaces face each other; and bonding the substrates together by urging the respective bonding surfaces together.

According to another aspect, a method for bonding substrates to one another is provided. The method comprises: providing a duality of substrates, each substrate including a bonding surface; depositing a layer of bonding material on each bonding surface, each layer of bonding material including an upper surface; and performing an oxide removal operation capable of removing oxide from the upper surfaces of the layers of bonding material. The method further provides depositing passivating material on the layer of bonding material, the passivating material having a lower melting point than the bonding material and the layer of bonding material and the passivating material combining to form a composite film structure; patterning the composite film structure to produce patterned segments; and bonding by heating and urging corresponding patterned segments of the substrates against each other by applying pressure, thereby forcing melting and lateral extrusion of the passivating material and substantially causing contact between the upper surfaces of the layers of bonding material of the respective substrates.

According to yet another aspect, provided is a method for bonding substrates to one another. The method comprises providing a first substrate and a second substrate, each substrate including a bonding surface. The method further comprises depositing a first bonding material on the bonding surface of the first substrate; depositing a second bonding material on the bonding surface of the second substrate; depositing a layer of the second bonding material on the first bonding material on the first substrate, thereby forming a first film stack and a first eutectic; depositing a layer of the first bonding material on the second bonding material on the second substrate, thereby forming a second film stack and a second eutectic; and bonding the first substrate to the second substrate.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for bonding substrates to one another, comprising:
    providing a duality of substrates, each said substrate including a bonding surface;
    depositing a layer of bonding material on each said bonding surface, each said layer of bonding material including an upper surface;
    roughening at least one said upper surface to produce a roughened uppermost, exposed surface;
    orienting said substrates such that said bonding surfaces, including said at least one roughened uppermost, exposed surface, face each other; and
    without covering either of said upper surfaces, bonding said substrates together by urging said respective bonding surfaces, including said uppermost, exposed surface, directly together such that said respective bonding surfaces, including said uppermost, exposed surface, directly contact one another.

2. The method as in claim 1, wherein said roughening comprises introducing a species into at least one said layer of bonding material by implantation or thermal diffusion to form grains within said layer of bonding material, then wet etching to remove a portion of said layer of bonding material.

3. The method as in claim 1, wherein said bonding comprises heating and applying pressure that urges said duality of substrates together.

4. The method as in claim 1, wherein said roughening produces a step height of grains on said roughened surface ranging from about 100 angstroms to about 2 μm.

5. The method as in claim 1, wherein said roughening comprises ion bombardment by one of sputter etching and ion milling.

6. The method as in claim 1, wherein said roughening comprises roughening by controlling parameters in later stages of said depositing a layer of bonding material, to produce said roughened upper surface.

7. A method for bonding substrates to one another, comprising:

providing a duality of substrates, each said substrate including a bonding surface;

depositing a layer of bonding material on each said bonding surface, each said layer of bonding material including an upper surface;

performing an oxide removal operation capable of removing oxide from said upper surfaces of said layers of bonding material;

depositing passivating material on at least one said layer of bonding material, said passivating material having a lower melting point than said corresponding bonding material and said layer of corresponding bonding material and said passivating material combining to form a composite film structure;

patterning said composite film structure to produce patterned segments; and bonding by heating and urging corresponding patterned segments of said substrates against each other by applying pressure, thereby forcing melting and lateral extrusion of said passivating material and substantially causing contact between said upper surfaces of said layers of bonding material of said respective substrates.

8. The method as in claim 7, wherein said performing an oxide removal operation comprises first performing a sputtering operation that removes any surface oxide formed on said upper surface of said bonding material, then performing a wet clean operation including at least HF, then performing a rinse operation.

9. The method as in claim 8, wherein said performing a wet clean operation comprises subjecting said upper surface to an HF dip, then exposing said upper surface to forming acid vapor, and said rinse operation comprises a DI water rinse.

10. The method as in claim 7, wherein a melting point of said passivating material is less than about 450° C.

11. The method as in claim 7, wherein said passivating material comprises at least one of Sn, Cu, Au, Ge, and Ni.

12. The method as in claim 7, wherein each said substrate comprises a semiconductor wafer with at least one semiconductor device thereon.

13. A method for bonding substrates to one another, comprising:

providing a first substrate and a second substrate, each said substrate including a bonding surface;

depositing a first bonding material on said bonding surface of said first substrate;

depositing a second bonding material on said bonding surface of said second substrate;

depositing a layer of said second bonding material on said first bonding material on said first substrate, thereby forming a first film stack and a first eutectic;

depositing a layer of said first bonding material on said second bonding material on said second substrate, thereby forming a second film stack and a second eutectic; and bonding said first substrate to said second substrate.

14. The method as in claim 13, wherein said depositing a layer of said second bonding material on said first bonding material forms a eutectic material with a lower melting point than said first bonding material, and said depositing a layer of said first bonding material on said second bonding material forms a eutectic material with a lower melting point than said second bonding material.

15. The method as in claim 13, further comprising patterning said first and second film stacks to produce patterned segments of each of said first and second film stacks prior to said bonding.

16. The method as in claim 13, further comprising performing an operation capable of removing oxide, upon said first bonding material prior to said depositing a layer of second bonding material thereover, and performing said operation capable of removing oxide, upon said second bonding material prior to said depositing a layer of first bonding material thereover.

17. The method as in claim 16, wherein said operation capable of removing oxide, comprises a sputtering operation to remove native oxide from an upper surface of said corresponding bonding material, then performing a wet clean operation including at least HF followed by a rinse.

18. The method as in claim 13, wherein said first substrate and said second substrate each comprise a semiconductor wafer with at least one semiconductor device thereon.

19. The method as in claim 13, wherein said first bonding material comprises Ge and said second bonding material comprises Al and each of said depositing a layer of said second bonding material and said depositing a layer of said first bonding material forms a Ge, Al.

20. A method for bonding substrates to one another, comprising:

providing a duality of substrates, each said substrate including a bonding surface;

depositing a layer of bonding material on each said bonding surface; each said layer of bonding material including an upper surface;

causing the formation of an uppermost, exposed surface with prominent apices on at least a first upper surface of said duality of upper surfaces by at least roughening at least said first upper surface;

orienting said substrates such that said bonding surfaces, including said at least one uppermost, exposed surface, face each other; and without covering either of said upper surfaces, bonding said substrates together by urging said bonding surfaces, including said at least one uppermost, exposed surface, into direct contact with one another.

21. The method as in claim 20, wherein said roughening produces a step height of grains on said first upper surface ranging from 100 angstroms to 2 μm and a plurality of sharp apices, said causing further comprises depositing further bonding material on said first upper surface between said roughening and said orienting, said further bonding material having said uppermost, exposed surface with prominent apices, and wherein said bonding comprises causing said prominent apices to break through any oxide layer.

22. The method as in claim 20, wherein each said substrate comprises a semiconductor wafer with at least one semiconductor device thereon and said causing includes depositing further bonding material on said at least one first upper surface after said roughening, said uppermost, exposed surface with prominent apices formed on said further bonding material.

23. The method as in claim 22, further comprising at least one of a) depositing a polysilicon seed layer and b) annealing to crystallize and increase grain size of said first upper surface to produce said uppermost, exposed surface with prominent apices, after said roughening and prior to said depositing further bonding material.

* * * * *